United States Patent [19]
Moslehi

[11] Patent Number: 6,048,162
[45] Date of Patent: Apr. 11, 2000

[54] WAFER HANDLER FOR MULTI-STATION TOOL

[75] Inventor: Mehrdad M. Moslehi, Los Altos, Calif.

[73] Assignee: CVC Products, Inc., Rochester, N.Y.

[21] Appl. No.: 09/141,180

[22] Filed: Aug. 27, 1998

Related U.S. Application Data

[60] Provisional application No. 60/057,715, Aug. 28, 1997.

[51] Int. Cl.[7] .................................................. B25J 18/04
[52] U.S. Cl. ........................ 414/744.6; 414/941; 414/217
[58] Field of Search ............................. 414/744.4, 744.5, 414/744.6, 404, 331, 416, 937, 941, 744.1, 217

[56] References Cited

U.S. PATENT DOCUMENTS

| | | |
|---|---|---|
| 4,775,281 | 10/1988 | Prentakis . |
| 4,909,314 | 3/1990 | Lamont, Jr. . |
| 4,949,783 | 8/1990 | Lakios et al. . |
| 5,151,008 | 9/1992 | Ishida et al. . |
| 5,192,849 | 3/1993 | Moslehi . |
| 5,314,294 | 5/1994 | Taniguchi et al. .................... 414/744.6 |
| 5,397,212 | 3/1995 | Watanabe et al. .................... 414/744.6 |
| 5,404,894 | 4/1995 | Shiraiwa ................................. 414/941 |
| 5,564,889 | 10/1996 | Araki . |
| 5,567,267 | 10/1996 | Kazama et al. . |
| 5,590,996 | 1/1997 | Thompson et al. ..................... 414/941 |
| 5,626,456 | 5/1997 | Nishi . |
| 5,647,724 | 7/1997 | Davis, Jr. et al. . |

Primary Examiner—Gregory A. Morse
Attorney, Agent, or Firm—Eugene Stephens & Associates

[57] ABSTRACT

A robotic wafer handler is mounted on a central platform of a cluster tool for transporting wafers between loading and processing stations. The wafer handler includes a main arm that is rotatable around a vertical axis, translatable along the vertical axis, and translatable along a horizontal axis that rotates with the main arm around the vertical axis. An auxiliary arm is translatable along the horizontal axis relative to the main arm between extended and retracted positions. In the extended position, an end effector of the auxiliary arm is aligned with an end effector of the main arm for retrieving or replacing wafers with the auxiliary arm. In the retracted position, the end effector of the auxiliary arm is withdrawn for retrieving or replacing wafers with the main arm.

36 Claims, 7 Drawing Sheets

WAFER HANDLER FOR MULTI-STATION TOOL

This application claims the benefit of U.S. Provisional Application Ser. No. 60/057,715, filed on Aug. 28, 1997, which provisional application is incorporated by reference herein.

TECHNICAL FIELD

The invention relates to the field of material handling including robotic handlers used for transporting wafers between stations for making electronic components such as semiconductors, storage devices, and flat panel displays. The term "wafers" is intended to encompass semiconductor materials as well as similarly processable substrates.

BACKGROUND

The manufacture of electronic components such as semiconductors, storage devices, and flat panel displays often takes place within a series of individual processing stations that perform specific operations such as deposition, etching, thermal processing, and cleaning. Stand-alone tools include a single processing station that can be connected to a loading station through a platform. Cluster tools include two or more processing stations that are connected with each other and to a loading station through a similar platform. Robotic wafer handlers mounted on the platforms move wafers, comprising various substrates, between the loading and processing stations.

In most such tools, the platforms are enclosed by a vacuum chamber; and valve gates control access between the vacuum chamber and the individual loading and processing stations. When closed, the valve gates isolate the stations for processing the wafers in discrete environments. The stations are evacuated prior to opening their respective valve gates to prevent the spread of contamination into the platform. When opened, the valve gates permit the exchange of wafers in various stages of processing between the stations within a partial vacuum.

The loading stations, which are also referred to as "load-lock chambers", can be sized to hold different numbers of wafers from a single wafer to one or more cassettes containing up to 25 Wafers each. Also, more than one loading station can be used for holding wafers in each tool; and one such station can be used for holding unprocessed wafers, and another such station can be used for holding processed wafers.

The robotic handlers generally have an articulated arm with an end effector for carrying a wafer. Drives provide for rotating the arm around a vertical axis, translating the arm short distances along the vertical axis, and translating the end effector portion of the arm along a horizontal axis. Generally, the handlers transport one wafer at a time. For example, the handlers pick up one wafer from a processing station, return it to a loading station, pick up another wafer from the loading station, and transport it to the processing station.

Such handling between operations delays value-added processing of wafers within the stations (i.e., the actual modification of wafers) and adds to the total time required to process wafers within the tools. In fact, the total processing time often exceeds the value-added processing time by a factor of four or more. This depresses production rates and adds to the cost of finished products.

Robotic handlers have also been made with two opposing arms having respective end effectors separated by 180 degrees. During processing by one of the stations, the end effector of one of the arms picks up a wafer from a loading station or a prior processing station. When processing is completed, the empty end effector extends into the processing station, picks up the processed wafer, and retracts. The two arms are then rotated through 180 degrees, and the other end effector is extended for placing its wafer into the same station.

Although such two-arm handlers are faster than one-arm robots for reloading wafers in processing stations, considerable time is wasted by requiring rotations through 180 degrees and by the separate extension of both end effectors into the processing stations. The two-arm handlers are also more costly, requiring more complex controls for positioning the two effectors.

SUMMARY OF INVENTION

My invention provides for reducing the total processing time of wafers, including a variety of substrates, in both stand-alone and cluster tools. A new robotic handler in accordance with my invention eliminates non-productive motions of prior robotic handlers. The new handler can be made as a substitute or an upgrade for existing handlers.

One example of my new robotic handler is mountable on a platform that interconnects the loading and processing stations of a stand-alone or cluster tool for processing wafers. Similar to prior robotic handlers, a main arm is connected to the platform and has a first end effector for supporting a first wafer. A first drive rotates the main arm with respect to the platform around a vertical axis, a second drive translates the main arm along the vertical axis, and a third drive translates the main arm along a horizontal axis that rotates with the main arm around said first axis.

However, my new robotic handler also has an auxiliary arm carried by the main arm. The auxiliary arm has a second end effector for supporting a second wafer. A fourth drive translates the auxiliary arm with respect to the main arm along the horizontal axis. A controller operates the drives for retrieving the second wafer from one of the stations and depositing the first wafer in the same station at a given angular position of the main arm. In other words, my invention provides for the exchange of processed and unprocessed wafers in a processing station without requiring the main arm to rotate out of alignment with the station.

The auxiliary arm is movable between two positions along the horizontal axis. In a first of these two positions, the first and second end effectors are aligned with each other along the vertical axis. In a second of these two positions, the first and second end effectors are spaced apart along the horizontal axis so that movement of the main arm along the vertical axis can position the first end effector in a space previously occupied by said second end effector. This arrangement allows both end effectors to be extended simultaneously into the processing station. The lowermost of the two effectors can be used to remove a processed wafer from the station, and the uppermost effector can be used to place an unprocessed wafer within the station.

More than one auxiliary arm can be carried by the main arm for supporting additional end effectors. Each auxiliary arm is preferably mounted on a linear bearing suspended from the main arm. Separate linear drives move each of the end effectors between the two positions along the horizontal axis. All of the end effectors are collectively movable by the first, second, and third drives.

The platform can include a vacuum chamber having valve gates for connecting the stations to the vacuum chamber.

The end effectors are sized to fit collectively through said valve gates for removing one of the wafers and replacing it with another wafer without further movement of the main arm around the vertical axis.

Assuming a wafer already processed within a first processing station, my invention can be practiced as a method by rotating the main and auxiliary arms into position in front of the first processing station, opening the valve gate separating the first station from the platform, and extending both of the arms into the first processing station. The auxiliary arm lifts a first-processed wafer from a support within the first processing station and withdraws together with the first-processed wafer from the first processing station. The main arm lowers an unprocessed wafer onto the support and also withdraws from the first processing station. The first-processed wafer carried by the auxiliary arm can be moved to the next processing station or returned to a loading station.

DETAILED DESCRIPTION

Figure 1:
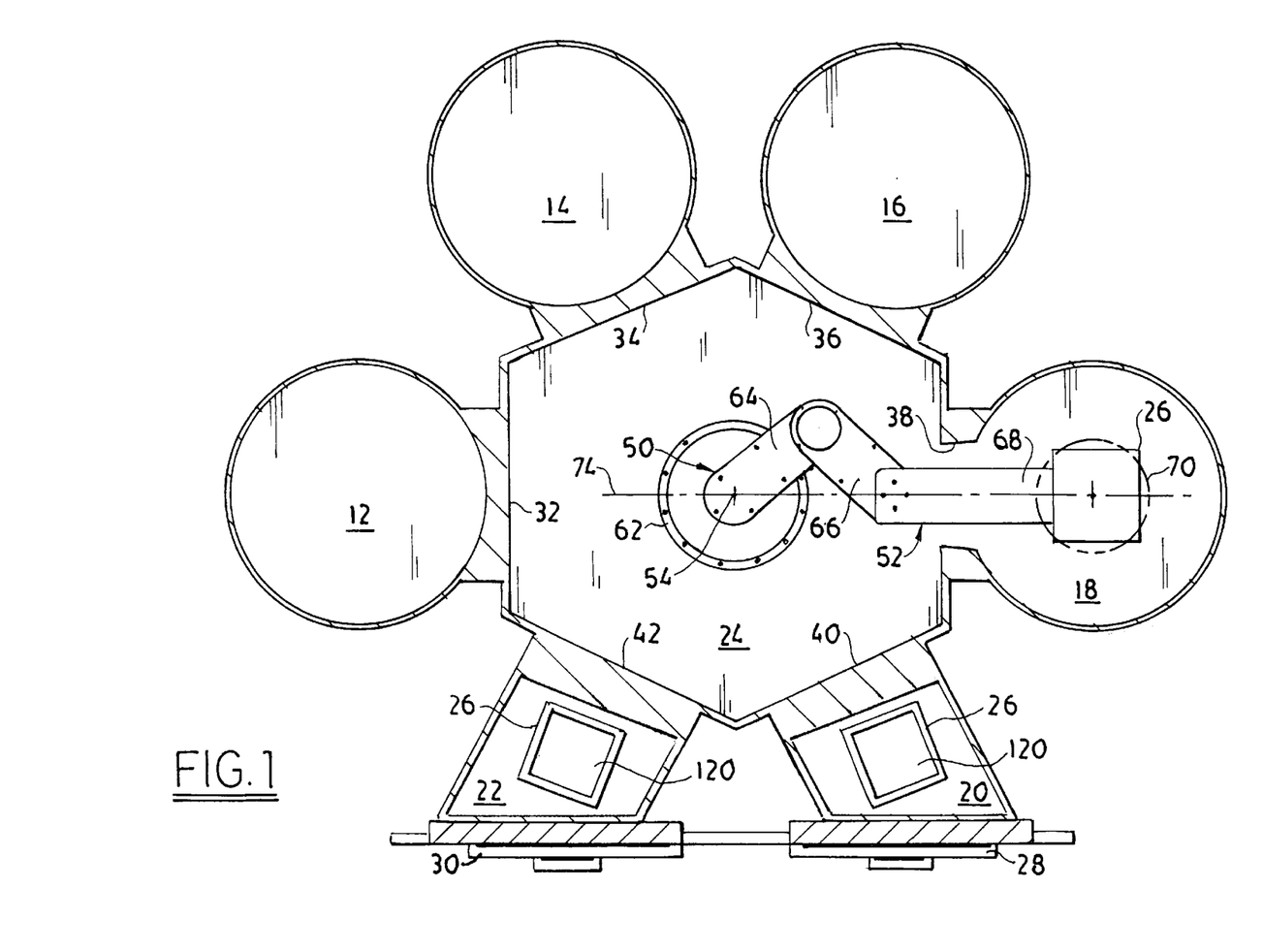
FIG. 1 is a schematic plan view of a cluster tool having a central platform supporting a wafer handler with a main arm extended into a processing station.
Figure 2:
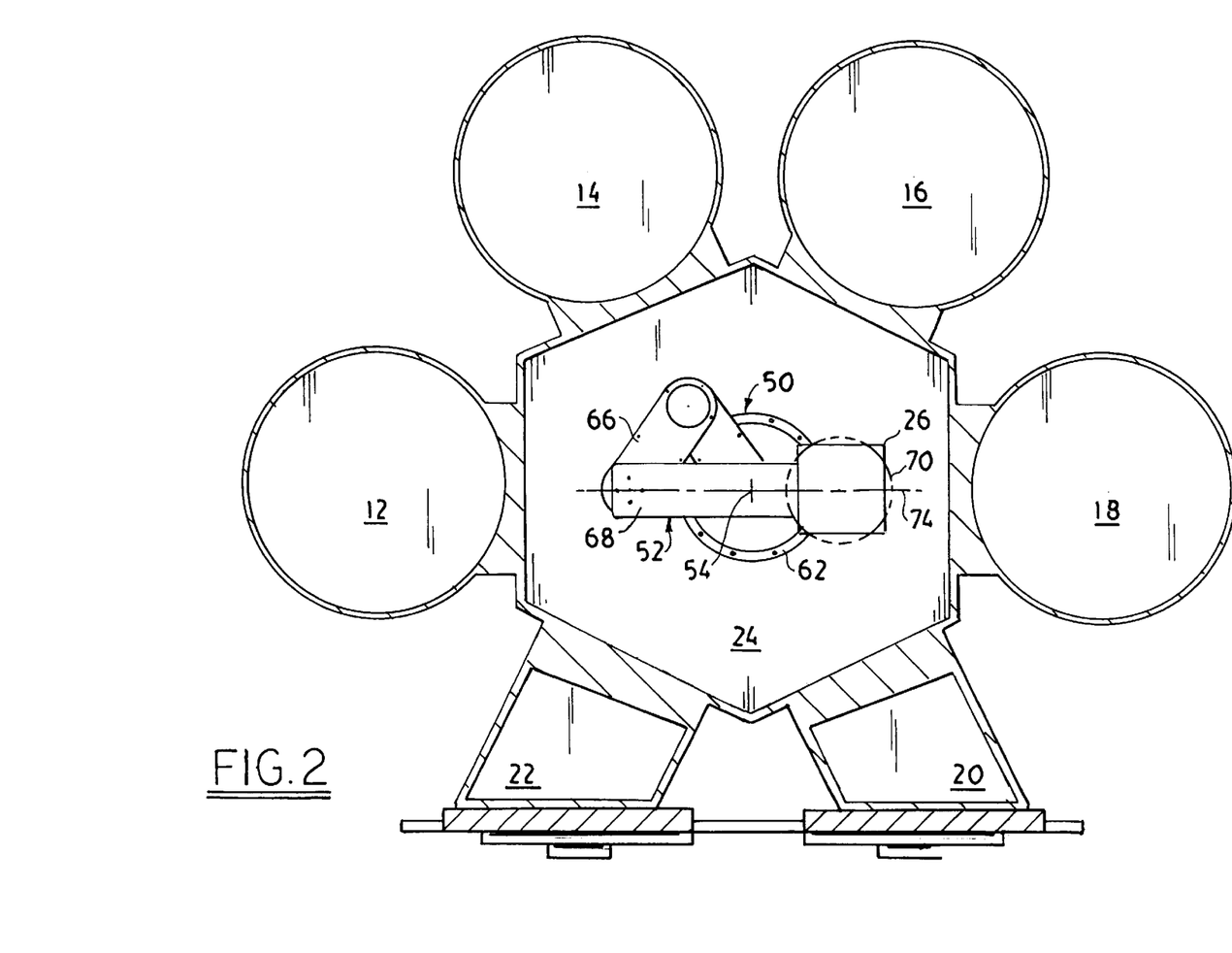
FIG. 2 is a schematic plan view similar to FIG. 1 but with the main arm withdrawn from the processing station.

A multi-station cluster tool 10 shown in FIGS. 1 and 2 includes four processing stations 12, 14, 16, and 18 and two loading stations 20 and 22 surrounding a central platform 24. The processing stations 12, 14, 16, and 18 perform specialized operations such as deposition, etching, thermal processing, and cleaning. The two loading stations 20 and 22, which can also be referred to as so-called "load-lock chambers", provide temporary storage for wafers 26, as well as an entryway and an exit for the wafers 26 through exterior valve gates 28 and 30.

The central platform 24 is connected to each of the processing and loading stations 12, 14, 16, 18, 20, and 22 through interior valve gates 32, 34, 36, 38, 40, and 42. When closed, the interior valve gates 32, 34, 36, 38, 40, and 42 enable the respective processing and loading stations 12, 14, 16, 18, 20, and 22 to maintain unique operating environments that can be evacuated prior to opening their respective valve gates. The central platform 24, which can be arranged as a vacuum chamber, can also be evacuated prior to opening the valve gates 32, 34, 36, 38, 40, and 42 to prevent the spread of contamination between the processing and loading stations 12, 14, 16, 18, 20, and 22.

A robotic wafer handler 50 is mounted on the central platform 24 for transporting the wafers 26 between the processing and loading stations 12, 14, 16, 18, 20, and 22. An articulated main arm 52 is mounted for rotation around and translation along a vertical axis 54. Respective rotational and linear drives 56 and 58 (see FIGS. 3 and 4) for moving the articulated arm 52 are contained within a main drive housing 60 that is isolated from the central platform 24 by a vacuum seal 62. The articulated main arm 52 has three relatively rotatable linkages 64, 66, and 68 and an end effector 70 for carrying one of the wafers 26. A drive 72 controls relative rotations between linkages 64, 66, and 68 for translating the end effector 70 along a horizontal axis 74 that rotates with the arm 52 around the vertical axis 54.

Figure 3:
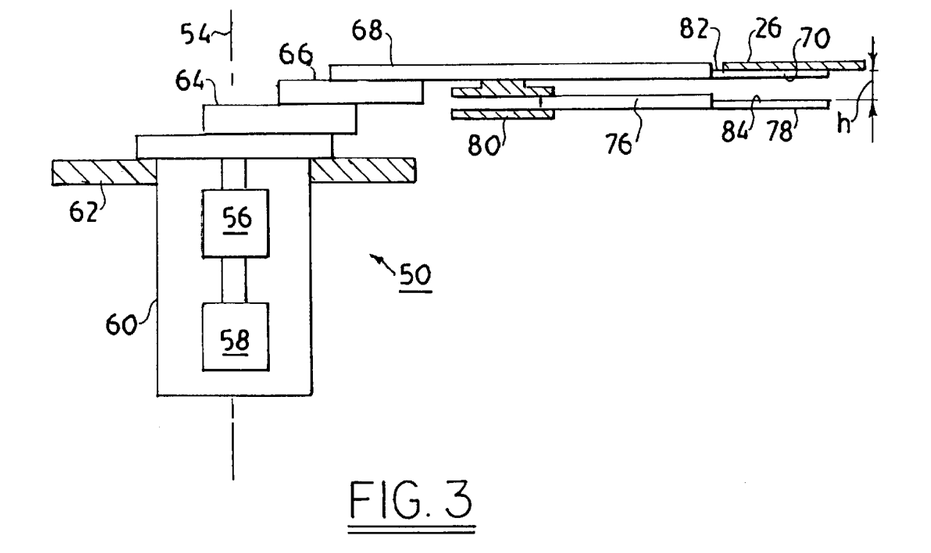
FIG. 3 is a schematic side view showing an auxiliary arm aligned with the main arm.
Figure 4:
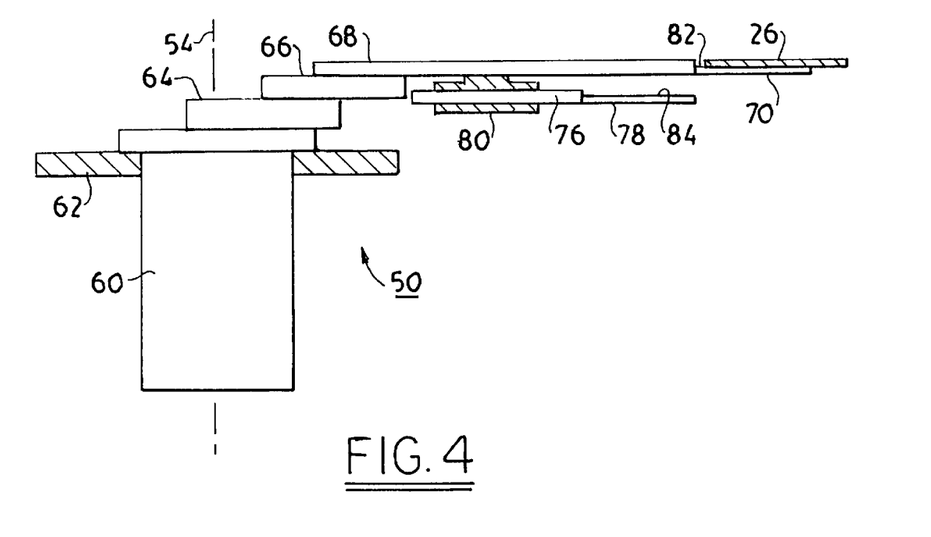
FIG. 4 is a schematic side view similar to FIG. 3 but with the auxiliary arm retracted.

An auxiliary arm 76 having an end effector 78 is suspended from the articulated main arm 52 by a linear bearing and motor actuator 80. Preferably, a non-contact magnetic bearing and actuator is used. The auxiliary arm 76 can be translated along the horizontal axis 74 between the positions shown in FIGS. 3 and 4. In the position of FIG. 3, the end effectors 70 and 78 are aligned with each other along the vertical axis 54. In the position of FIG. 4, the end effector 78 is retracted along the horizontal axis 74 to provide clearance for the end effector 70 to pick up or place one of the wafers 26 on a support within one of the stations 12, 14, 16, 18, 20 or 22.

The end effectors 70 and 78 have respective carrying surfaces 82 and 84 that are spaced apart through distance "h" along the vertical axis 54. The main arm 52 is movable along the vertical axis 54 through at least the distance "h" to position the end effector 70 in a space previously occupied by the end effector 78 prior to its retraction for picking up or placing one of the wafers 26 within a station. Also, the two end effectors 70 and 78 are sized to fit collectively through the valve gates 32, 34, 36, 38, 40, and 42 for removing one of the wafers 26 and replacing it with another of the wafers 26 at a single angular position of the main arm 52 around the vertical axis 54.

Figure 5:
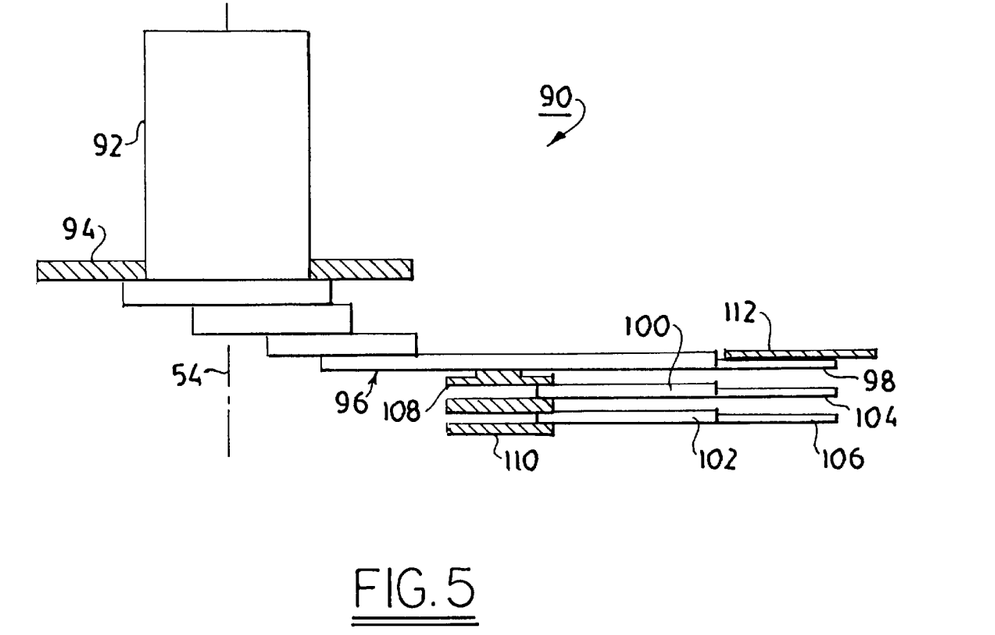
FIG. 5 is a schematic side view of an alternative wafer handler having a main arm and two auxiliary arms.

FIG. 5 shows an alternative wafer handler 90 that is mounted in an inverted position with respect to the wafer handler 50 along the vertical axis 54. A main drive housing 92 is connected lo a top of the platform 24 through a vacuum interface 94. An articulated main arm 96 having an end effector 98 is similar in construction to the articulated arm 52 of the prior embodiment. However, the articulate arm 96 supports two auxiliary arms 100 and 102 having respective end effectors 104 and 106. The three end effectors 98, 104, and 106 are sized with respect to the valve gates 32, 34, 36, 38, 40, and 42 to permit unrestricted access to the processing and loading stations 12, 14, 16, 18, 20, and 22.

Respective drives for the auxiliary arms 100 and 102 include linear bearings and motor actuators 108 and 110. The end effectors 104 and 106 are independently movable by the auxiliary arms 100 and 102 between extended positions aligned with the end effector 98 and retracted positions that enable the end effectors 98 or 104 to pick up or place a wafer 112 on a support within one of the stations. The main arm 96 is translatable along the vertical axis 54 through a distance at least equal to two times the distance "h" between adjacent end effectors for positioning the end effector 98 in a position occupied by the end effector 106 prior to retraction.

Figure 6:
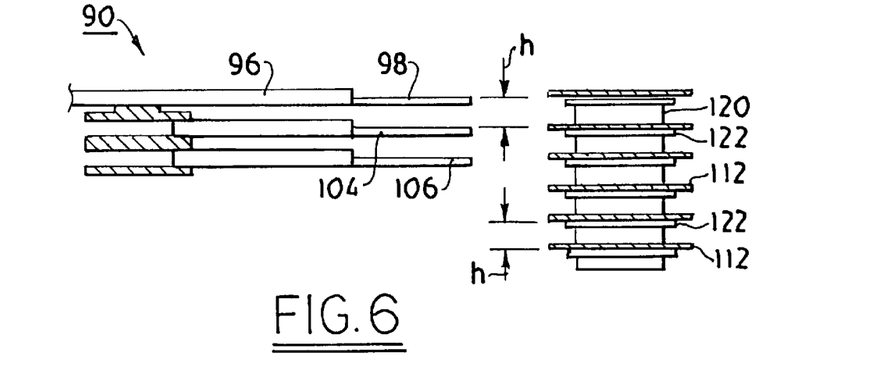
FIG. 6 is a schematic side view of a portion of the alternative wafer handler aligned with a cassette of a loading station.

In FIG. 6, the main arm 96 is aligned with a wafer cassette 120 within one of the loading stations 20 and 22. The wafer cassette 120 holds a stack of wafers 112 on supports 122 that are also spaced through the distance "h". Accordingly, the main arm 96 can be translated along the horizontal and vertical axes 74 and 54 for simultaneously transferring three of the wafers 112 from the wafer cassette 120 to the end effectors 98, 104, and 106. This reduces the number of times that the loading stations 20 or 22 must be accessed for retrieving or returning the wafers 112.

Figure 7:
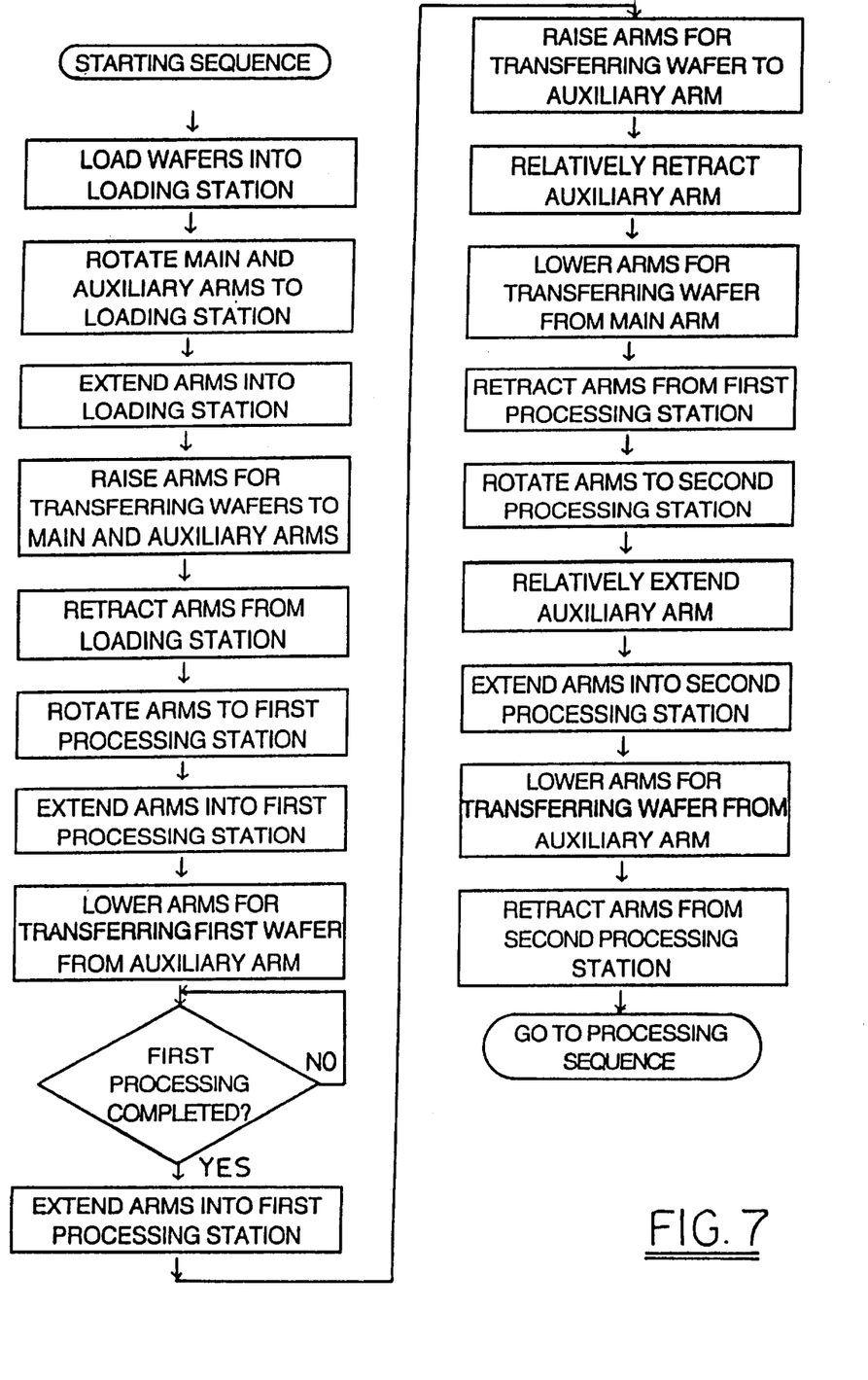
FIG. 7 is a flow chart of a starting sequence for operating my new wafer handler in a cluster tool.
Figure 8:
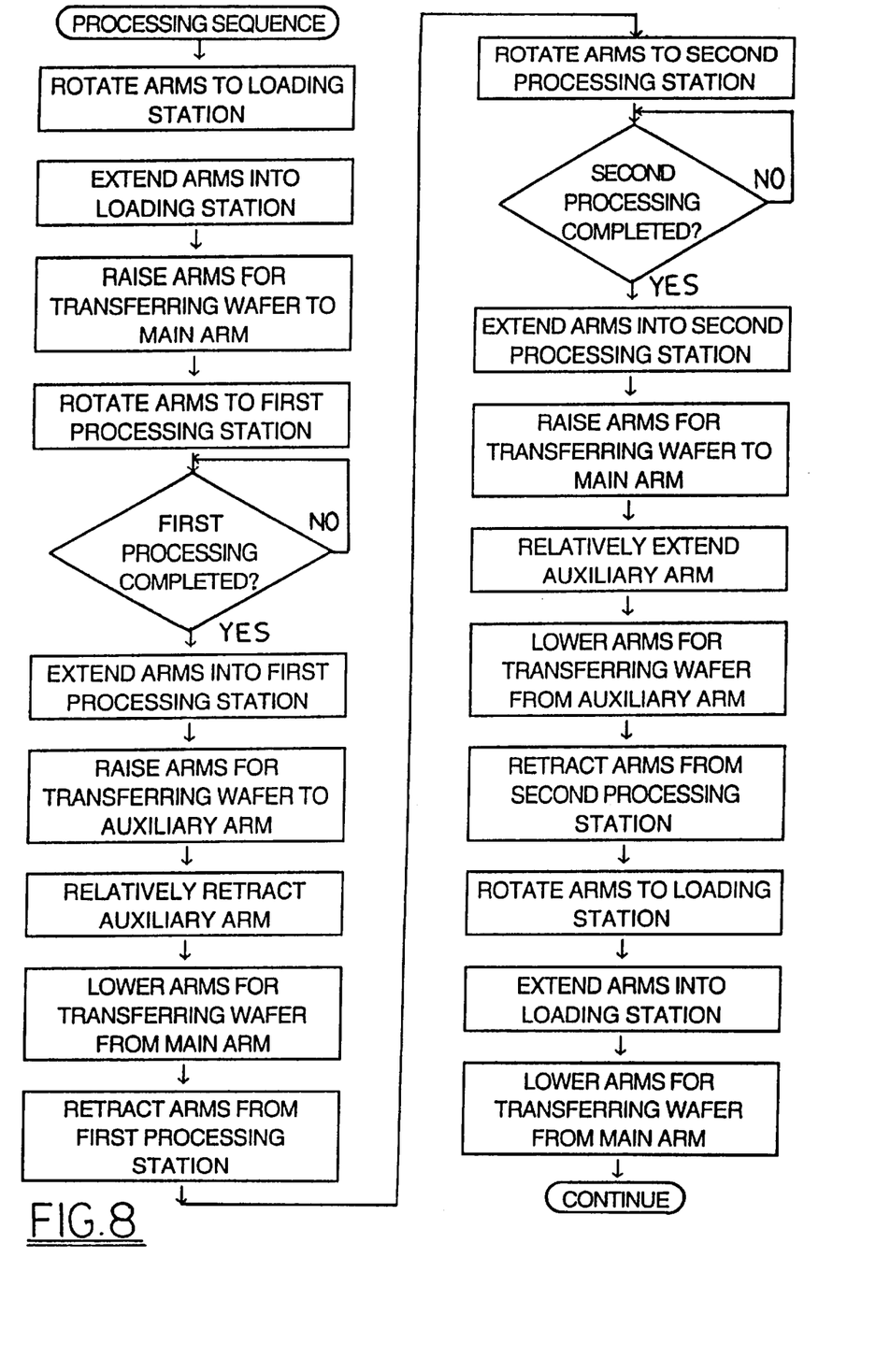
FIG. 8 is a flow chart of a processing sequence for operating the same wafer handler.
Figure 9:
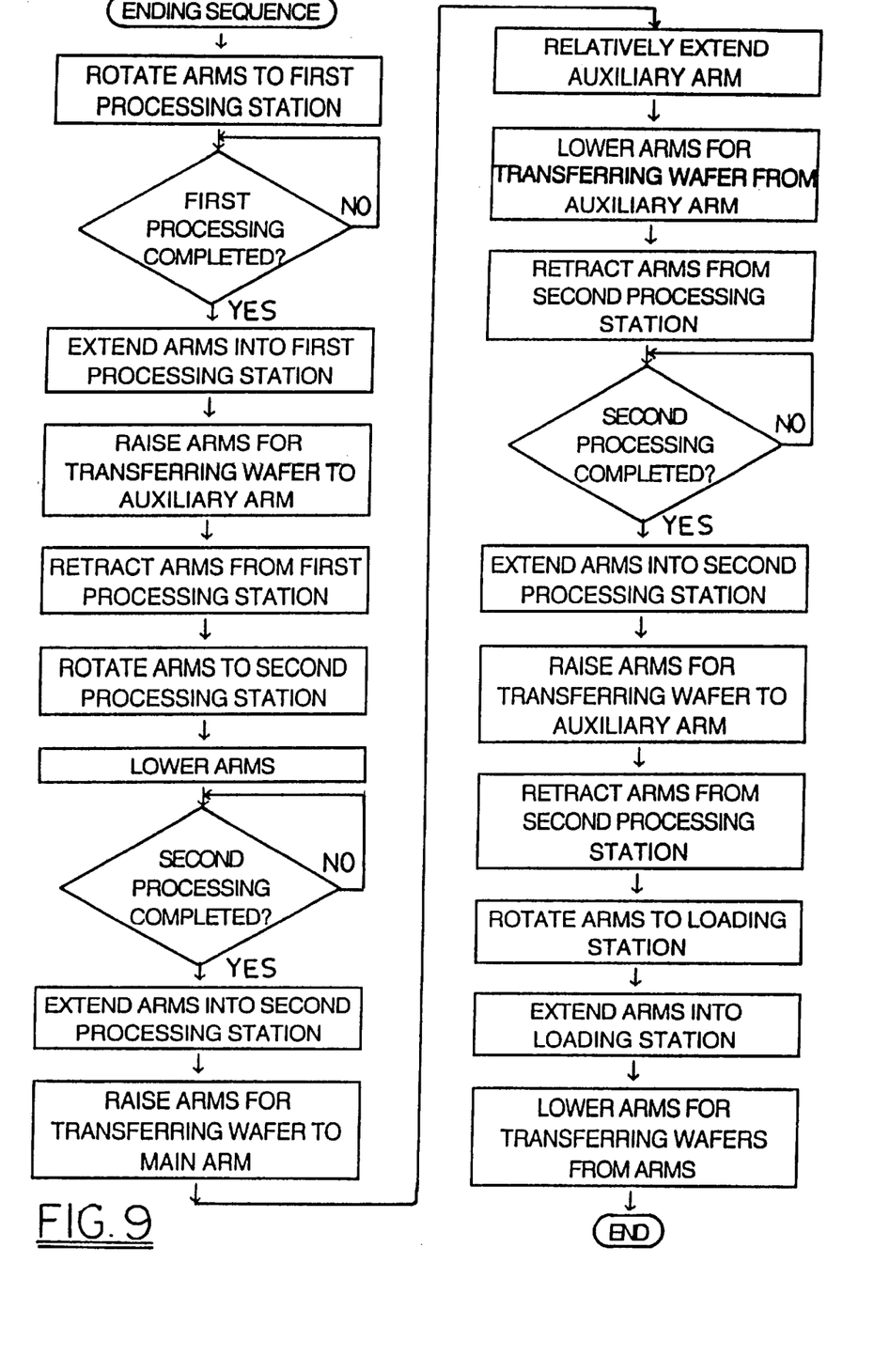
FIG. 9 is a flow chart of an ending sequence for operating the wafer handler.

The remaining FIGS. 7–9 are flow charts showing examples of new processes that are made possible by my new wafer handler. For simplicity, the processes assume a cluster tool having a single loading station and two processing stations and a wafer handler having main and auxiliary arms. The starting sequence of FIG. 10 shows improved efficiencies made possible by transferring multiple wafers from the loading station. The processing sequence of FIG. 10 shows improved efficiencies made possible by transferring the wavers both to and from each processing station at singular angular positions of the main arm. The ending sequence of FIG. 11 shows further efficiencies made possible by transferring multiple wafers to the loading station.

For example, the starting sequence of FIG. 7 includes steps for rotating the main and auxiliary arms to a loading station, extending both arms into the station, and raising the arms for simultaneously transferring wafers to the respective arms. Thereafter, the wafers are moved to a position in front of a processing station where they can be used in sequence without reaccessing the loading station.

The processing sequence of FIG. 8 includes two different procedures for exchanging wafers with processing stations. The first procedure provides for extending both arms into the processing station, raising both arms to pick up a first-processed wafer with the auxiliary arm, retracting the auxiliary arm with the first-processed wafer, and lowering the arms to deposit another wafer with the main arm. The second procedure assumes the auxiliary arm is relatively retracted with the first-processed wafer. The arms are raised to pick up a second-processed wafer with the main arm, the auxiliary arm is extended, and the arms are lowered for depositing the first-processed wafer. Both procedures provide for the removal and replacement of wafers in processing stations without rotating the wafer handler away from the respective stations.

The ending sequence of FIG. 9 provides for sequentially retrieving two finish-processed wafers with the main and auxiliary arms and simultaneously transporting both finished-processed wafers to the loading station. Once at the loading station, the arms are extended and lowered for returning both wafers to supports within the loading station. Additional auxiliary arms could be used for simultaneously transferring more than two wafers to and from the loading stations.

My invention can also be practiced with a variety of other modifications including mounting one or more of the auxiliary arms above the main arm. The auxiliary arm would still be movable between retracted and extended positions. However, the retracted position would align the end effectors of the main and auxiliary arms, and the extended position would provide clearance with the main arm for transferring wafers from the auxiliary arm. Alternatively, all of the arms could be provided with some relative motion, as long as the lower arms are relatively retractable with respect to the upper arms.

The main arm and end effectors could also be formed in a variety of configurations for transporting wafers. For example, the main arm could be constructed from various linkages that produce straight line motion such as frog-legged linkages. The end effectors could be made with other spatular shapes or be constructed as grips, clamps, or holders. The various drives can include various computer-controlled actuators including motors and solenoids operating through mechanical linkages or magnetic fields.

I claim:

1. A robotic handler mountable on a platform that interconnects loading and processing stations of a tool for processing wafers comprising:

a main arm mountable on the platform and having a first end effector for supporting a first wafer;

a first drive for rotating said main arm with respect to the platform around a first axis;

a second drive for translating said main arm with respect to the platform along said first axis;

a third drive for translating said main arm with respect to the platform along a second axis that rotates with said main arm around said first axis;

an auxiliary arm supported and guided by a linear bearing of said main arm and having a second end effector for supporting a second wafer;

a fourth drive for translating said auxiliary arm along said linear bearing of said main arm along said second axis; and a controller that operates said drives for retrieving the second wafer from one of the stations and depositing the first wafer in the same station at a given angular position of said main arm.

2. The robotic handler of claim 1 in which said auxiliary arm is movable between two positions along said second axis; and in a first of said two positions, said first and second end effectors are aligned with each other along said first axis for using said auxiliary arm to deposit the second wafer within the station.

3. The robotic handler of claim 2 in which a second of said two positions of the auxiliary arm provides clearance between said first and second end effectors along said second axis for using said main arm to deposit the first wafer within the station.

4. The robotic handler of claim 3 in which said main arm is movable along said first axis through a first distance sufficient to position said first end effector in a space previously occupied by said second end effector for using the main arm to deposit the first wafer within the station.

5. The robotic handler of claim 4 in which said first and second end effectors have respective wafer-carrying surfaces that are spaced at a second distance from each other along said first axis.

6. The robotic handler of claim 5 in which said first distance is not less than said second distance.

7. The robotic handler of claim 6 further comprising a second auxiliary arm operationally connected to said main arm and having a third end effector for supporting a third wafer.

8. The robotic handler of claim 7 further comprising a fifth drive for translating said second auxiliary arm with respect to said main arm along said second axis.

9. The robotic handler of claim 8 in which said first distance through which said main arm is movable along said first axis is sufficient to position said first end effector in a space previously occupied by said third end effector for depositing the first wafer within the station.

10. The robotic handler of claim 9 in which said third end effector has a carrying surface that is spaced from the carrying surface of the second end effector through a third distance that is approximately equal to said second distance.

11. The robotic handler of claim 10 in which said first distance is not less than a sum of said second and third distances.

12. The robotic handler of claim 6 further comprising a loading station having wafer supports that are spaced at a fourth distance.

13. The robotic handler of claim 12 in which said second and fourth distances are approximately equal.

14. The robotic handler of claim 1 in which said first drive rotates said main arm together with said auxiliary arm around said first axis.

15. The robotic handler of claim 14 in which said second drive translates said main arm together with said auxiliary arm along said first axis.

16. The robotic handler of claim 15 in which said third drive translates said main arm together with said auxiliary arm along said second axis.

17. The robotic handler of claim 16 in which said linear bearing suspends said auxiliary arm from said main arm.

18. The robotic handler of claim 17 in which said fourth drive includes a linear motor actuator.

19. A central handling system for a wafer processing tool having a plurality of stations comprising:

a platform for interconnecting the stations;

upper and lower arms operationally connected to said platform and having respective upper and lower end effectors for supporting wafers;

a first drive for collectively rotating said upper and lower arms around a vertical axis;

a second drive for collectively translating said upper and lower arms along said vertical axis;

a third drive for translating at least one of said upper and lower arms along a horizontal axis that is rotatable with said upper and lower arms around said vertical axis;

a fourth drive for relatively retracting said lower arm with respect to said upper arm along said horizontal axis;

a controller that operates said drives for relatively retracting said lower end effector with respect to said upper end effector and for lowering said upper end effector into a position occupied by said lower end effector prior to its retraction; and said lower arm suspended from said upper arm by a linear bearing.

20. The handling system of claim 19 in which said platform includes a vacuum chamber having valve gates for connecting the stations to the vacuum chamber.

21. The handling system of claim 20 in which said upper and lower end effectors are sized to fit collectively through said valve gates for removing one of the wafers and replacing it with another wafer at a single angular position of said upper and lower arms around said vertical axis.

22. The handling system of claim 21 further comprising a middle arm operationally connected to said platform and having a middle end effector for supporting a wafer.

23. The handling system of claim 22 further comprising a fifth drive for relatively retracting said middle arm with respect to said upper arm along said horizontal axis.

24. The handling system of claim 23 in which said first drive collectively rotates said upper, middle, and lower arms around said vertical axis; and said second drive collectively translates said upper, middle, and lower arms along said vertical axis.

25. The handling system of claim 24 in which said upper, middle, and lower end effectors are sized to fit collectively through said valve gates for removing one of the wafers and replacing it with another wafer at a single angular position of said upper, middle, and lower arms around said vertical axis.

26. The handling system of claim 20 in which portions of said first and second drives are separated from said vacuum chamber by a vacuum interface.

27. The handling system of claim 26 in which said third drive collectively translates said upper and lower arms along said horizontal axis.

28. The handling system of claim 27 in which said fourth drive includes a linear motor actuator for retracting said lower arm with respect to said upper arm along said horizontal axis.

29. The handling system of claim 20 in which said lower arm is relatively movable with respect to said upper arm between two positions along said horizontal axis; and in a first of said two positions, said upper and lower end effectors are aligned with each other along said vertical axis.

30. The handling system of claim 29 in which a second of said two positions of the lower arm provides clearance between said lower end effector and said valve gate to one of the stations while said upper end effector is positioned within the same station for depositing a wafer.

31. The handling system of claim 30 in which said upper and lower end effectors have respective carrying surfaces that are spaced at a fixed distance from each other along said vertical axis.

32. The handling system of claim 31 in which said upper and lower arms are movable along said vertical axis through at least said fixed distance for depositing the wafer.

33. A method of transporting wafers between stations of a multi-station tool comprising the steps of:

rotating first and second arms of a robot assembly into position in front of a first processing station;

extending both of the arms into the first processing station;

lifting a first-processed wafer from a support within the first processing station using the second arm;

relatively withdrawing the second arm with respect to the first arm;

lowering an unprocessed wafer on the support within the first processing station using the first arm;

withdrawing both of the arms from the first processing station; and rotating both of the arms into position in front of another station.

34. The method of claim 33 in which the another station is a second processing station, and including the further steps of:

extending the first arm into the second processing station;

lifting a second-processed wafer from a support within the second processing station using the first arm;

relatively extending the second arm into approximate alignment with the first arm;

lowering the first-processed wafer on the support within the second processing station using the second arm;

withdrawing both of the arms from the second processing station; and rotating both of the arms into position in front of yet another station.

35. The method of claim 33 in which the another station is a loading station, and including the further steps of:

extending both arms into the unloading station;

lowering two of the second-processed wafers onto supports within the loading station using both arms; and withdrawing both arms from the loading station.

36. The method of claim 33 in which the robot assembly includes a third arm, and including the initial steps of:

rotating all three arms into position in front of a loading station;

extending all three arms into the loading station;

picking three unprocessed wafers from the loading station using the first, second, and third arms;

withdrawing all three arms from the loading station; and rotating all three arms into position in front of the first processing station.

* * * * *